(12) United States Patent
Geiger et al.

(10) Patent No.: US 6,798,814 B2
(45) Date of Patent: Sep. 28, 2004

(54) GAS DISCHARGE LASER, METHOD OF OPERATING A GAS DISCHARGE LASER, AND USE OF A SINTERED FILTER

(75) Inventors: Stephan Geiger, Hebertshausen (DE); Claus Strowitzki, Gilching (DE); Tobias Pflanz, Munich (DE); Ansgar Matern, Germering (DE); Thomas Petracek, Munich (DE); Martin Kappels, Worthsee (DE); Andreas Goertler, Weil (DE)

(73) Assignee: TuiLaser AG, Germering (DE)

( * ) Notice: Subject to any disclaimer, the term of this patent is extended or adjusted under 35 U.S.C. 154(b) by 104 days.

(21) Appl. No.: 10/205,567

(22) Filed: Jul. 25, 2002

(65) Prior Publication Data

US 2003/0039291 A1 Feb. 27, 2003

(30) Foreign Application Priority Data

Jul. 25, 2001 (EP) .......................................... 01117652

(51) Int. Cl.⁷ ................................................ H01S 3/22
(52) U.S. Cl. ............................. 372/59; 372/58; 372/61; 372/65
(58) Field of Search ............................. 372/59, 58, 61, 372/55, 57, 98

(56) References Cited

U.S. PATENT DOCUMENTS

| 4,534,034 | A | 8/1985 | Hohla et al. ................... 372/59 |
| 5,027,366 | A | 6/1991 | Akins et al. ................... 372/57 |
| 5,029,177 | A | 7/1991 | Akins et al. ................... 372/57 |
| 5,359,620 | A | 10/1994 | Akins et al. ................... 372/58 |
| 5,917,066 | A | 6/1999 | Eisenmann et al. ........... 55/502 |
| 6,340,378 | B1 * | 1/2002 | Hinrichsen ................... 75/436 |
| 2002/0023419 | A1 * | 2/2002 | Penth et al. ................... 55/523 |
| 2003/0039291 | A1 * | 2/2003 | Geiger et al. ................. 372/55 |

FOREIGN PATENT DOCUMENTS

| DE | 3212928 | 10/1983 | |
| EP | 0669047 | 1/1999 | .......... H01S/3/225 |
| FR | 2545994 A1 * | 5/1983 | ............. H01S/3/09 |
| JP | 62243380 | 10/1987 | |
| JP | 11167146 A * | 6/1999 | .......... G03B/15/00 |
| JP | 2000357830 A * | 12/2000 | ............. H01S/3/03 |
| WO | WO-WO 94/11931 | 5/1994 | |

* cited by examiner

*Primary Examiner*—Leon Scott, Jr.
(74) *Attorney, Agent, or Firm*—Schwegman, Lundberg, Woessner & Kluth, P.A.

(57) ABSTRACT

The invention relates to a gas discharge laser including a discharge tube (1), in which a gas is present and which has at least one aperture (19) through which a laser beam emerges or at which a laser beam is reflected. For withdrawing a partial amount of the gas contained in the discharge tube (1), at least one gas withdrawal point (9) is present, from which the withdrawn gas is supplied to a sintered filter (11) for being cleaned. The cleaned gas may be led in via at least one gas inlet point (27) in the zone of the aperture (19). The invention further relates to a method of operating a gas discharge laser, and the use of a sintered filter for cleaning gas withdrawn from a discharge tube (1) of a gas discharge laser.

37 Claims, 2 Drawing Sheets

GAS DISCHARGE LASER, METHOD OF OPERATING A GAS DISCHARGE LASER, AND USE OF A SINTERED FILTER

RELATED APPLICATION

This application claims priority under 35 U.S.C. 119 from European Application No. 01 117 652.6, filed Jul. 25, 2001, which application is incorporated herein by reference.

TECHNICAL BACKGROUND

The present invention relates to a gas discharge laser having a discharge tube, in which a gas is present. The discharge tube has at least one aperture or window through which a laser beam emerges, or at which a laser beam is reflected. It may also be possible that the at least one aperture or window reflects a part of the laser beam and let through a part of the laser beam. At least one gas withdrawal point is provided for taking out a partial amount of the gas present within the gas discharge tube. The withdrawn amount of gas is guided through a filtering means, and is introduced in at least one gas inlet point in the zone of the aperture.

The invention further relates to a method of operating a gas discharge laser having a discharge tube, in which a gas is present, and which has at least one aperture through which a laser beam emerges, or at which a laser beam is reflected. At least a partial amount of the gas contained within the discharge tube is taken out, is cleaned by means of a filtering means and is fed in again in the zone of the at least one aperture. The cleaned gas flow may be fed in again in the zone of the at least one aperture in such a manner that a gas flow is formed directed away from the aperture. This can, for example, be achieved in that the cleaned gas flow will be directed towards the aperture, thereby rinsing the aperture free from possible dust particles and other adhering matter, whereupon the gas flow then is deflected into a direction directed away from the aperture. By this deflection of the gas flow, the penetration of dust particles from the interior of the discharge tube is avoided to a large extent, at least, however, impeded.

Finally, the invention relates to a novel use of a filtering means in the aforementioned technical field.

In gas discharge lasers—in particular excimer lasers—a gas is excited to emit light by means of an excitation and/or discharge reaction. The molecular or atomic compounds particularly suited for excimer lasers, which are also designated as gas or gases in the following for convenience, present energy transmissions by means of which electromagnetic radiation is preponderantly emitted in the ultraviolet spectral range. Therefore, excimer lasers nowadays represent the by far most intensive UV radiation sources. However, a high energy density is necessary for the excitation of the gases so as to generate stimulated emissions, which energy density is fed in in the form of an intensive pulsed electron beam or within the scope of a high-voltage discharge, since the effective cross-section for stimulated emission for the individual initial compounds within the gas is relatively small.

In the technical configuration of gas discharge lasers of this type, and in particular in excimer lasers, a particularly high effort in the constructional and set-up configuration has to be implemented for the components necessary for the targeted energy supply. Due to the very high energies which have to be fed in the excimer gas, impurities moreover occur in a system-contingent manner resulting, for example from local electrode fusing by compound reactions between the gas and the individual laser components. Said impurities, however, do not only affect the laser process as such, but are able to considerably reduce the beam outlet intensity of the laser due to deposits on the inner wall of the gas chamber enclosing the gas, and in particular in the zone of the initially mentioned apertures of the laser. Such deposits or dust particles hence can significantly affect the permeability of an outlet aperture or the reflection capability of a mirror. This problem increasingly occurs in lasers having a short wavelength, such as UV lasers.

From U.S. Pat. No. 4,534,034, a pumped gas discharge laser is believed to be known, wherein the gas present in the discharge tube is conveyed by means of a thereto connected but outside situated circulation pump through an electrostatic filter, so as to filter out dust particles etc. present in the gas. The cleaned gas flow is in each case fed into a zone of a aperture of the discharge tube after passing through a particular relaxation zone, so that the apertures possibly are kept clean by said gas flow, hence free from dust particles or other kinds of deposits. This solution may be subject to the problem that electrostatic dust collectors have a relatively large volume and require a separate voltage supply. Moreover, intricate relaxation zones here appear to be necessary in the gas conveyance system.

In U.S. Pat. No. 5,029,177, an excimer laser is believed to be disclosed, wherein likewise an electrostatic filter is provided for cleaning the gas in the discharge tube. For the transport of the gas flow through the electrostatic filter, the ventilator drum present in the discharge tube is used. The gas cleaned in the electrostatic filter flows in through an annular gap immediately in front of a aperture of the discharge tube. A pre-chamber in front of the apertures has a structure breaking the shock waves from the discharge, and impeding the gas flow and the movement of gas particles from the discharge towards the aperture.

From EP 0 669 047 B1, means are believed to be known for maintaining a clean laser aperture. Here, in particular, the structure of a pre-chamber in front of the aperture is described in more detail. The particular structure of the pre-chamber—as in the above-mentioned publication— serves the purpose of creating a gas flow directed away from the aperture in the direction of the discharge, so as to impede the movement of dust into the pre-chamber in front of the aperture. Here, in addition, it is disclosed that apart from the gas present in the discharge tube, a second gas is used. To avoid an electric charge of the gases, an electrically grounded screen in front of the aperture is proposed.

SUMMARY OF THE INVENTION

It is an object of the invention to specify a technically simple solution for keeping apertures or windows in gas discharge lasers clean.

It is an other object of the invention to specify a cost efficient solution for keeping apertures or windows in gas discharge lasers clean.

It is an other object of the invention to specify a technically simple method to keep apertures or windows in gas discharge lasers clean.

According to one aspect of the present invention, this is achieved by means of a gas discharge laser comprising a discharge tube, in which a gas is present. This discharge tube has at least one aperture through which a laser beam emerges, and/or from which the laser beam is reflected. In the discharge tube, at least one gas withdrawal point is present for withdrawing a partial amount of the gas present in the discharge tube, and to feed it to a sintered filter for cleaning the withdrawn amount of gas. The sintered filter cleans the infed gas as far as possible from dust particles and such like. The cleaned gas flow is then fed in via at least one gas inlet point in the area of the at least one aperture, so that a dirtying of the aperture by dust particles present in the discharge tube may be prevented. Moreover, the respective aperture will probably be rinsed free from dust particles possibly adhering thereto.

In one exemplary embodiment of the present invention, the cleaned gas flow counteracts the pressure waves generated by the discharge, which transport dust particles away from the discharge—and inter alia towards the apertures.

The present invention may be based on the idea of using for the first time a sintered filter for cleaning a gas flow withdrawn from the discharge tube. As may be derived from the preceding explanations as to the documents mentioned above, electrostatic filters have always been used up to date for cleaning gases in technical devices of the kind of interest here. Surprisingly, however, it has turned out that sintered filters, despite their high flow resistance which has to be overcome by the gas flow, can also be used in gas discharge lasers of the initially mentioned kind. With sintered filters, a cost-efficient and maintenance-friendly alternative and completion, respectively, to the hitherto used electrostatic filters is for the first time given. In particular, the problems entailed by electrostatic filters may now be avoided or at least reduced.

In an other exemplary embodiment of the present invention a circulation means is present in the discharge tube, circulating the gas contained in the discharge tube and simultaneously conveying the gas flow from the withdrawal point through the sintered filter up to the gas inlet point. In other words: the entire circulation of the gas flow to be guided through the sintered filter may be performed by the circulation means present as such, and any additional and hence expensive pumping means therewith is probably not necessary. This configuration hence may have the advantage that the circulation means present as such in the discharge tube can also be used at the same time for generating the gas flow through the sintered filter, without complicated modifications of the circulation means becoming necessary. Namely, it has surprisingly turned out that the conveyance of a gas flow through a sintered filter affected as such by high flow resistance, is also possible with the means used up to date.

In an other exemplary embodiment of the present invention, one single gas withdrawal point is present for withdrawing gas from the discharge tube. From this single gas withdrawal point, several gas inlet points for several apertures are supplied. In this embodiment, hence only one withdrawal point is necessary in the discharge tube, however, a branched gas conduct system to the individual apertures might be necessary for this purpose. In this exemplary embodiment of the present invention, it is imaginable to provide a common sintered filter for all apertures. Yet, it is also possible to insert a sintered filter downstream of the branching of the common gas withdrawal point in each line.

In an other exemplary embodiment of the present invention, several gas withdrawal points are present for withdrawing gas from the discharge tube, and each withdrawal point is assigned to an aperture. In the associated gas conduct lines, a sintered filter is in each case additionally installed. This exemplary embodiment of the present invention can have the advantage that short line paths to the apertures suffice, whereby the line resistance is kept low, as well.

In an other exemplary embodiment of the present invention, the at least one gas withdrawal point for withdrawing gas from the discharge tube is present at the outlet of the circulation means. Thus, the kinetic energy of the circulated gas in the discharge tube is converted in probably an optimum manner into a gas conveyance flow in the direction of the sintered filter.

As has already been mentioned, in an exemplary embodiment of the present invention the circulation means preferably is a ventilator drum, which per se is present in a gas discharge laser such as an excimer laser.

In an other exemplary embodiment of the present invention, at least one gas withdrawal point for withdrawing gas from the discharge tube is arranged at the end of the ventilator drum, and the ventilator drum is longer in this zone than electrodes located at the discharge tube. Due to this arrangement, a gas conduct to the sintered filters and the respective apertures may be performed in an optimum manner, and the constructional effort is minimized.

In an other exemplary embodiment of the present invention, the gas withdrawal point is configured as a distributor tube made of a non-conductor material. In an alternative exemplary embodiment of the present invention, it is also imaginable that the distributor tube is arranged at an adequate distance from the components carrying high voltage. In this case, the material connection may not restricted to non-conducting materials.

So as to prevent major amounts of gas soiled with dust particles from reaching the respective apertures, it is preferred in an other exemplary embodiment of the present invention that a partition is arranged in front of the at least one aperture, which partition has, as compared to the tube cross-section of the discharge tube, a small opening interconnecting a pre-chamber formed by the partition in front of the aperture and the interior of the discharge tube. Into this pre-chamber debouches the gas inlet point.

Of course, it is moreover possible in other exemplar embodiments of the present invention to use in addition the means known per se, which possibly prevent dust from the discharge tube from reaching to the apertures.

In a further exemplary embodiment of the present invention the gas discharge laser is an excimer laser.

According to another aspect of the present invention, a method of operating a gas discharge laser, such as an excimer laser having a discharge tube, in which a gas is present, and which has at least one aperture or window through which a laser beam emerges and/or at which a laser beam is reflected. According to the inventive method, at least a partial amount of the gas contained in the discharge tube is cleaned in a sintered filter and is fed in again in the zone of the at least one aperture or window.

In a further exemplary embodiment of the present invention, the partial amount of gas cleaned in the sintered filter is fed in again in the zone of the at least one aperture or window in such a manner that a gas flow forms directed away from the aperture.

In a further exemplary embodiment of the present invention, a circulation means present in the discharge tube for the continuous circulation of the gas contained in the discharge tube is also used for conveying the gas flow withdrawn from the discharge tube through the sintered filter towards the aperture. Therewith, a separate circulation pump may be avoided, and the constructional effort for the use of the sintered filter may be kept low at the same time.

As has already been mentioned at the beginning, the use of a sintered filter for cleaning a gas flow withdrawn from the discharge tube of a gas discharge laser surprisingly is proposed for the first time, which gas flow is directed towards a aperture of the discharge tube for cleaning purposes.

In a further exemplary embodiment of the present invention a sintered filter can be used having pore sizes up to 10,000 nm and above. As the filter material of such sintered filters, for example, nickel, stainless steel or Hastelloy alloy are used.

In a further exemplary embodiment of the present invention, nickel is preferred from the group of materials mentioned above. Filters of that kind are, for example, produced by the company Mott of Connecticut, USA.

One skilled in the art will recognize that the terms "aperture" and "window" define the same constructional part of a gas discharge laser. Hence, the use of one of the these terms does not limit the scope of protection of the present invention. Furthermore, the terms aperture and window comprise as such all embodiments known by on skilled in the art. In particular, these terms comprise windows, which are partly or fully transmissive, and which partly or fully reflect a laser beam. A window or aperture according to the present invention may also be defined as an optical element.

BRIEF DESCRIPTION OF THE DRAWINGS

For further explanation and better understanding, several exemplary embodiments of the present invention will be described in detail in the following. Therein shows:

As shown in FIG. 1, an excimer laser comprises a discharge tube 1 configured as an elongate cylinder, which is terminated at its two front sides by a front flange 17 (cf. FIGS. 2 and 3). Within the gas discharge tube 1, two electrodes 6, 7 extend in the longitudinal direction thereof, which are spaced apart from each other. On the level of the free interspace between the two electrodes 6, 7, an outlet opening 8 is arranged on the front side, which outlet opening is closed by a aperture 19. Said aperture 19 can be an outlet aperture or a mirror. A detailed explanation of the mounting of such apertures 19 follows further below by means of FIGS. 2 and 3.

Figure 2:
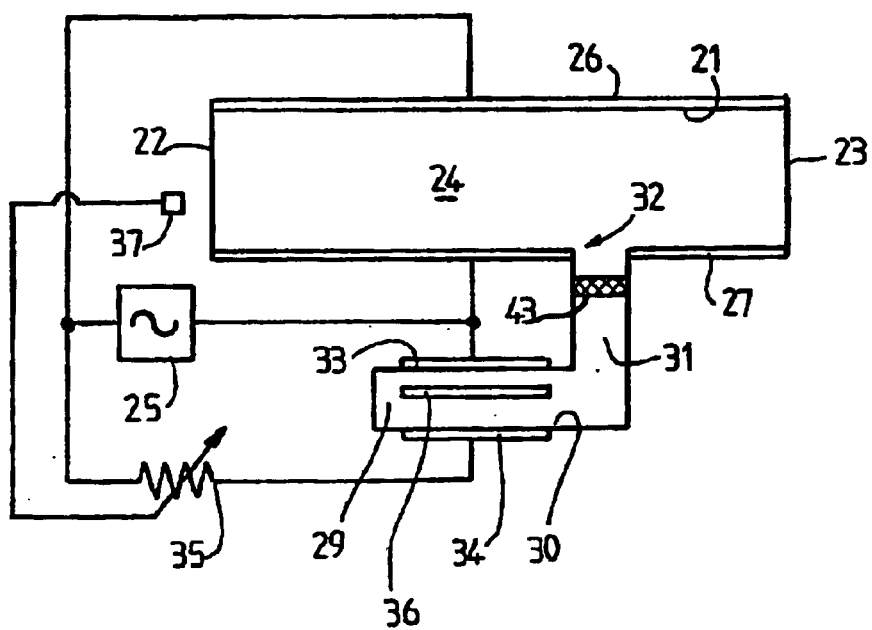
Figure 2:
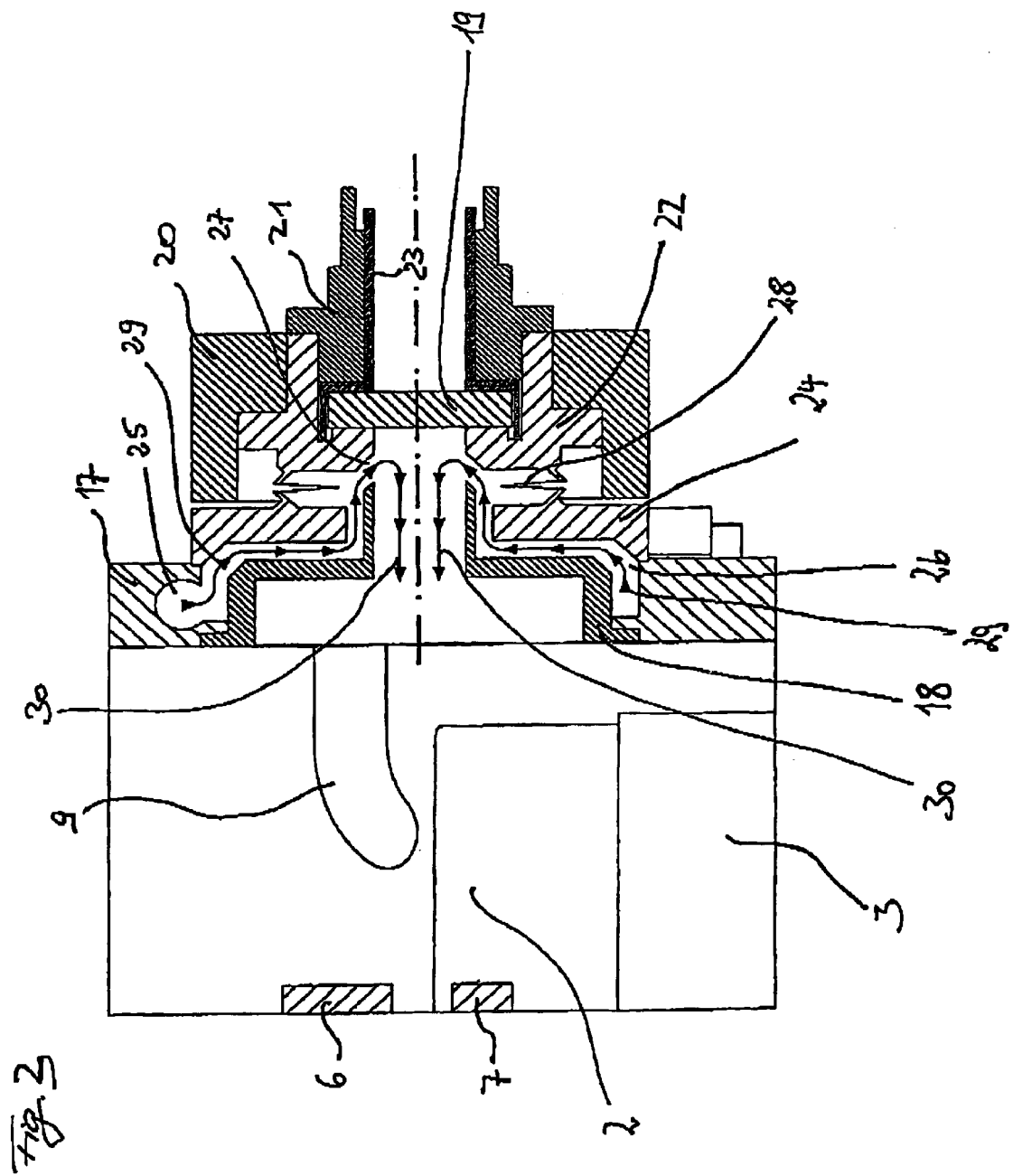

Underneath the electrodes 6, 7, a cooling means 3 is arranged essentially extending, as can be seen from FIG. 2, over the entire length of the discharge tube 1. Underneath the cooling means 3, a dust collector 5 is located covered by a cover plate 4.

Figure 1:
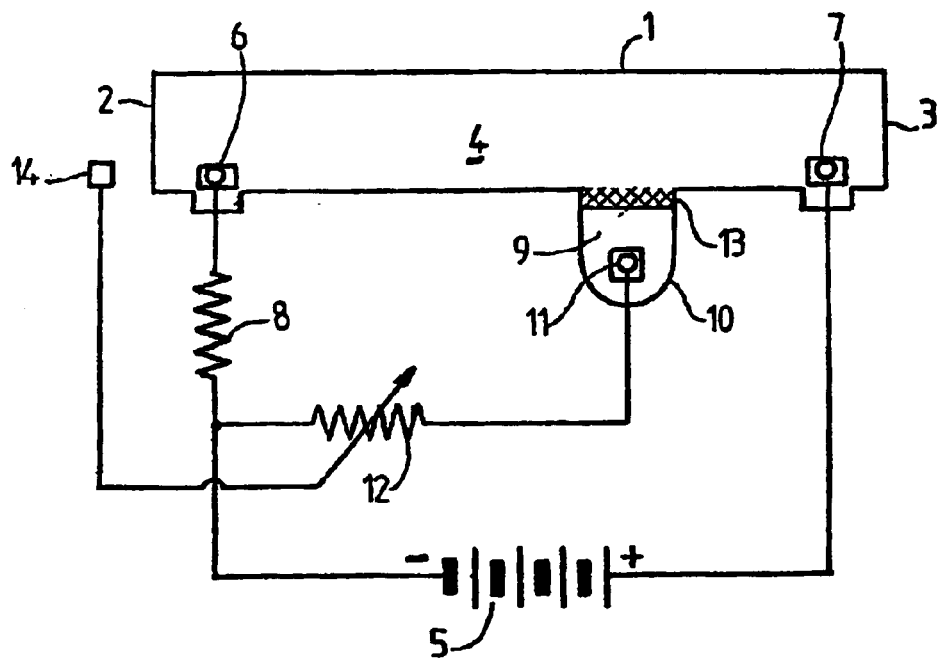
FIG. 1 a schematic cross-section of a discharge tube of an excimer laser, having a gas withdrawal system and a gas supply system with a sintered filter installed therein, FIG. 2 a longitudinal section along the line A—A of FIG. 1, and FIG. 3 an enlarged partial view of the longitudinal section shown in FIG. 2.

In the cut view as per FIG. 1, on the left side in the interior of the discharge tube 1, a ventilator drum 2 is provided equipped with single blades so as to circulate the gas in the discharge tube. The ventilator drum 2 likewise extends almost over the entire length of the discharge tube 1, and is in particular longer than the electrodes 6, 7, what may be derived from the representation as per FIGS. 2 and 3. This means that the ventilator drum 2 projects in the longitudinal direction of the discharge tube opposite the electrodes 6, 7 beyond the two ends thereof.

As can be derived from FIGS. 2 and 3, each front flange 17 features an outlet opening 8 closed by a aperture 19. In the representation shown, the aperture is an outlet aperture 19 through which the generated laser beam emerges from the discharge tube 1. The aperture 19 is inserted in a lens holder 23 featuring an annular projection for this purpose. The lens holder 23 in turn is pressed against a lens flange 22 by a lens nut 21, so that the aperture 19 is clamped in between the lens flange 22 and the lens holder 23. The lens flange 22 is in connection with a second lens flange 24 via a bellow 28, The latter is held in the front flange 17.

Via an adjustable lens holder 20, the overall lens system may be adjusted in three directions by tilting. The lens holder 20 is kept on the front flange 17 of the discharge tube 1 by three screws, one of them being fixed, the second exhibiting a degree of freedom, and the third exhibiting two degrees of freedom. In principle, the lens holder 20 may also be used for the adjustment of the gap width of the gas inlet annular gap 27 between the lens flange 22 and a flow conduct 18, whereby the cleaned gas flow 29 directed towards the aperture 19 is adjustable in its amount as well as in its speed. For this purpose, the adjustable lens holder 20 would have to be displaced with the same angle adjustment in the laser beam direction, which is established after adjustment of the lens. In practice, however, the adjustment of the lens (angle alignment) by means of an adjustable lens holder 20 has priority over the adjustment of the gap width.

The gas inlet annular gap 27 is in connection with a gas conduct annular gap 26, which is supplied by a gas inflow opening 25. The gas conduct annular gap 26, as well as the gas inlet annular gap 27 are predetermined in their dimensions by the flow conduct 18 and the lens flange 24, Reference is again made to FIG. 1. As can herefrom be seen, a gas distributor tube 9 is present close to the ventilator drum 2 through which distributor tube, due to the kinetic energy of the gas circulated in the discharge tube 1, an uncleaned gas flow 14 is continuously withdrawn. For this purpose, the distributor tube 9 is connected with a sintered filter 11 via a gas conduct line 10. The sintered filter 11 in turn is in connection with a gas conduct line 12 leading into an feed-in bore 13 in the front flange 17. The sinterd filter 11 here is accommodated outside of the discharge tube 1, and thus can be replaced for maintenance purposes or cleaned in an optimum and extremely simple manner.

Through the distributor tube 9, hence a partial amount of the uncleaned gas in the discharge tube 1 is continuously withdrawn, flows as gas flow 14 into the sintered filter 11, and is cleaned therein The cleaned gas flow 15 flows through the gas conduct line 12 up to the feed-in bore 13 and debouches there into the gas inflow opening 25 in the front flange 17. There, it is distributed in a ring-shape and flows through the gas inlet annular gap 27 obliquely into the direction of the aperture 19. Obliquely means here that between the main flow direction of the gas flow in the gas inlet annular gap 27 and the center axis of the aperture 19, an angle of about 45° is embraced, said angle, however, may also vary between 10° and 80°.

The gas flow impinging from the gas inlet annular opening 27 on the aperture 19 provides for a cleaning of the aperture 19 and is then deflected into the direction of the electrodes 6 and 7, and flows again, directed away from the aperture (gas current 30), into the interior of the discharge tube 1.

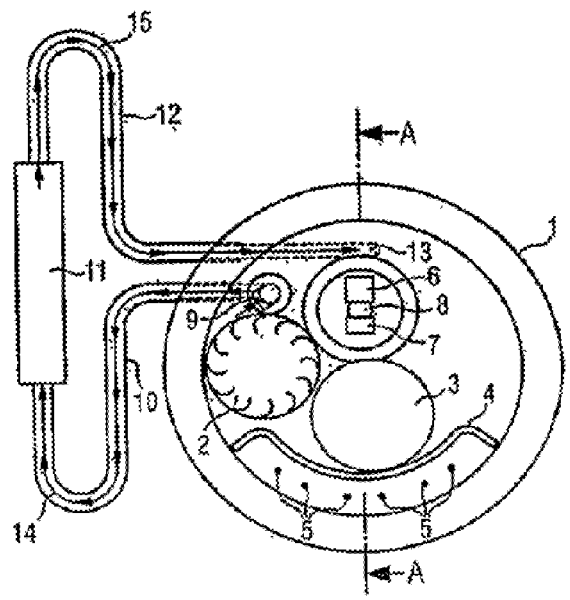

What is claimed:

1. A gas discharge laser comprising:
    a discharge tube, in which a gas is present, and which has at least one window,
    at least one gas withdrawal point for withdrawing a partial amount of the gas present in the discharge tube, a sintered filter for cleaning the withdrawn amount of gas, and at least one gas inlet point in the zone of the window through which the gas cleaned in the sintered filter can be led in.

2. The gas discharge laser of claim 1, wherein within said discharge tube, a circulation is present and adapted circulated the gas contained in the discharge tube and to convey in addition the gas flow from the withdrawal point through the sintered filter up to the gas inlet point.

3. The gas discharge laser of claim 1, wherein a single gas withdrawal point is present for withdrawing gas from the discharge tube, with which gas withdrawal point several gas inlet points for several apertures are in connection.

4. The gas discharge laser of claim 1, wherein several gas withdrawal points are present for withdrawing gas from the discharge tube, and each withdrawal point is assigned to a window.

5. The gas discharge laser of claim 1, wherein the at least one gas withdrawal point for withdrawing gas from the discharge tube is present at the outlet of the circulation means.

6. The gas discharge laser of claim 2, wherein the circulation means is a ventilator drum.

7. The gas discharge laser of claim 6, wherein the at least one gas withdrawal point for withdrawing gas from the discharge tube is arranged at the end of the ventilator drum, and wherein the ventilator drum is longer in said zone than electrodes located in the discharge tube.

8. The gas discharge laser of claim 1, wherein a distributor tube of a non-conductor material is present at the gas withdrawal point.

9. The gas discharge laser of claim 1, wherein a distributor tube is present at the gas withdrawal point, and wherein the distributor tube is arranged at an adequate distance from components carrying high voltage.

10. The gas discharge laser of claim 1, wherein the discharge tube has a cross-section, and wherein a partition is arranged in front of the at least one window, which has, as compared to a tube cross-section of the discharge tube, a small opening interconnecting a pre-chamber formed by the partition in front of the aperture and the interior of the discharge tube, the gas inlet point being arranged in said pre-chamber.

11. The gas discharge laser of claim 1, wherein dust protection means are present, which possibly prevent dust from the discharge tube from reaching the window.

12. The gas discharge laser of claim 1, wherein the sintered filter is a sintered metal filter.

13. The gas discharge laser of claim 12, wherein the sintered metal filter has pore sizes up to 10,000 nm and above.

14. The gas discharge laser of claim 12, wherein the filter material of such sintered metal filters is chosen from the group comprising nickel, stainless steel or Hastelloy alloy or mixtures thereof.

15. The gas discharge laser of claim 1, wherein the sintered filter includes nickel.

16. The gas discharge laser of claim 1, wherein the sintered filter includes stainless steel.

17. The gas discharge laser of claim 1, wherein the sintered filter includes Hastelloy alloy.

18. A gas discharge laser comprising:

a discharge tube, in which a gas is present, and which has a plurality of windows, a plurality of gas withdrawal points each for withdrawing a partial amount of the gas present in the discharge tube, a plurality of sintered filters for cleaning an withdrawn amount of gas, wherein each sintered filter has an inlet, an outlet, and at least one sintered filter element arranged between the inlet and the outlet, and wherein each inlet of each sintered filter is connected with one gas withdrawal point, a plurality of gas inlet points, wherein each gas inlet point is connected with an outlet of the sintered filters, and wherein each gas inlet point is arranged in the zone of a window.

19. The gas discharge laser of claim 18, wherein each sintered filter of the plurality of sintered filters is a sintered metal filter.

20. The gas discharge laser of claim 19, wherein each sintered metal filter has pore sizes up to 10,000 nm and above.

21. The gas discharge laser of claim 19, wherein the filter material of such sintered metal filters is chosen from the group comprising nickel, stainless steel or Hastelloy alloy or mixtures thereof.

22. A gas discharge laser comprising:

a discharge tube, in which a gas is present, and which has a plurality of windows, a plurality of gas withdrawal points each for withdrawing a partial amount of the gas present in the discharge tube, a plurality of sintered filters for cleaning an withdrawn amount of gas, wherein each sintered filter has an inlet, an outlet, and at least one sintered filter element arranged between the inlet and the outlet, and wherein each inlet of each sintered filter is connected with one gas withdrawal point, a plurality of gas inlet points through which the gas cleaned in the sintered filter can be led in the zone of the window, wherein each gas inlet point is connected with an outlet of the sintered filters, and a circulation means circulating the gas contained in the discharge tube and conveying in addition the gas flow from the withdrawal points through the sintered filters up to the gas inlet points.

23. The gas discharge laser of claim 22, wherein each sintered filter of the plurality of sintered filters is a sintered metal filter.

24. The gas discharge laser of claim 23, wherein each sintered metal filter has pore sizes up to 10,000 m and above.

25. The gas discharge laser of claim 23, wherein the filter material of such sintered metal filters is chosen from the group comprising nickel, stainless steel or Hastelloy alloy or mixtures thereof.

26. A method of operating a gas discharge laser including a discharge tube, in which a gas is present, and which has at least one window through which emerges a laser beam or at which the laser beam is reflected, wherein the method comprises the following method steps:

withdrawing at least one partial amount of the gas contained within the discharge tube from the discharge tube, cleaning the partial amount of the gas withdrawn from the discharge tube in a sintered filter, and introducing the partial amount of the gas cleaned in the sintered filter at the at least one window.

27. The method of claim 26, wherein the partial amount of the gas withdrawn from the discharge tube and cleaned in the sintered filter is fed in again in the zone of the at least one window in such a manner that a gas flow directed away from said window is formed.

28. The method of claim 27, wherein the withdrawal of gas from the discharge tube ensues at the outlet of the circulation means for circulating the gas in the discharge tube.

29. The method of claim 27, wherein the circulation means is a ventilator drum.

30. The method of claim 29, wherein the withdrawal of gas from the discharge tube ensues at the end of the ventilator drum, and wherein the ventilator drum is longer in this zone than electrodes located in the discharge tube.

31. The method of claim 26, wherein the gas present in the discharge tube is continuously circulated by means of a circulation means, and wherein the conveyance of the gas flow withdrawn from the discharge tube through the sintered filter towards the window ensues by means of the same circulator.

32. The method of claim 26, wherein the discharge tube has several windows to be impinged by a gas flow, a partial gas amount, however, is only withdrawn in a single common point, said withdrawn amount of gas is cleaned in a single sintered filter, and is distributed to the windows after the cleaning process in the sintered filter.

33. The method of claim 26, wherein the discharge tube has several windows, and wherein in a corresponding number of points, partial gas amounts are withdrawn from the discharge tube, are in each case cleaned in a sintered filter, and are then each guided to a window.

34. The method of claim 26, wherein a partition is arranged in front of the at least one window, which partition has, as compared to the tube cross-section of the discharge tube, a small opening interconnecting a pre-chamber formed by the partition in front of the aperture and the interior of the discharge tube, the gas cleaned in the sintered filter being led into said pre-chamber.

35. The method of claim 26, wherein the at least one sintered filter is a sintered metal filter.

36. The method of claim 26, wherein the sintered metal filter has pore sizes up to 10,000 nm and above.

37. The method of claim 26, wherein the sintered metal filter comprises nickel, stainless steel, Hastelloy alloy or mixtures thereof.

* * * * *

UNITED STATES PATENT AND TRADEMARK OFFICE
CERTIFICATE OF CORRECTION

PATENT NO. : 6,798,814 B2
APPLICATION NO. : 10/205567
DATED : September 28, 2004
INVENTOR(S) : Stephan Geiger et al.

It is certified that error appears in the above-identified patent and that said Letters Patent is hereby corrected as shown below:

Please replace the drawing figure on the Title page of the patent and Fig. 1 with the following

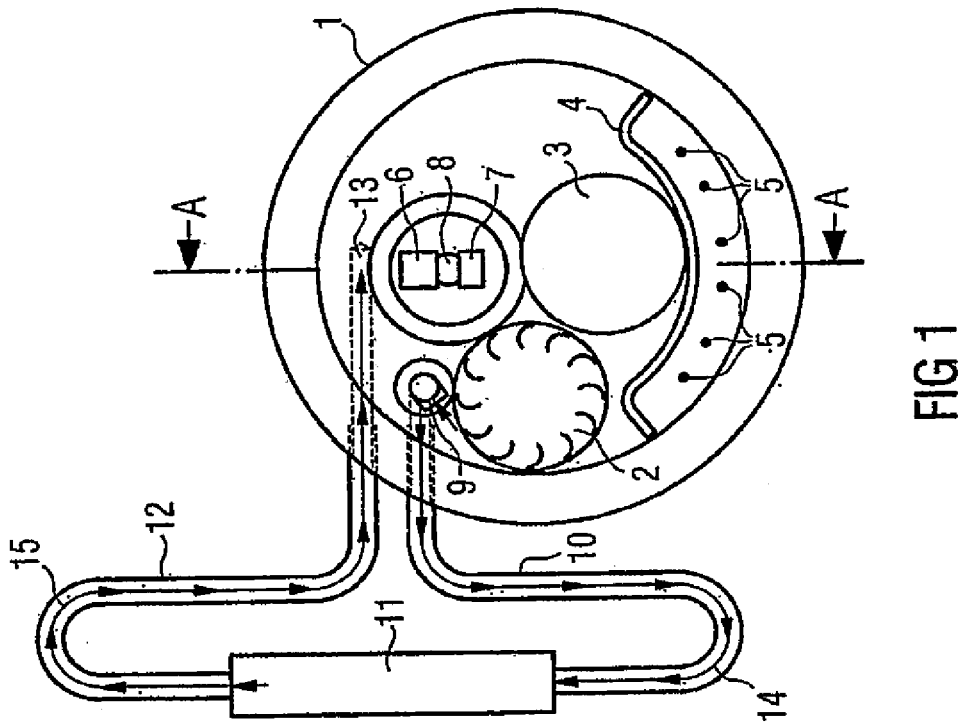

FIG 1

UNITED STATES PATENT AND TRADEMARK OFFICE
CERTIFICATE OF CORRECTION

PATENT NO.         : 6,798,814 B2
APPLICATION NO. : 10/205567
DATED                 : September 28, 2004
INVENTOR(S)       : Stephan Geiger et al.

It is certified that error appears in the above-identified patent and that said Letters Patent is hereby corrected as shown below:

Delete figure 2 and replace with

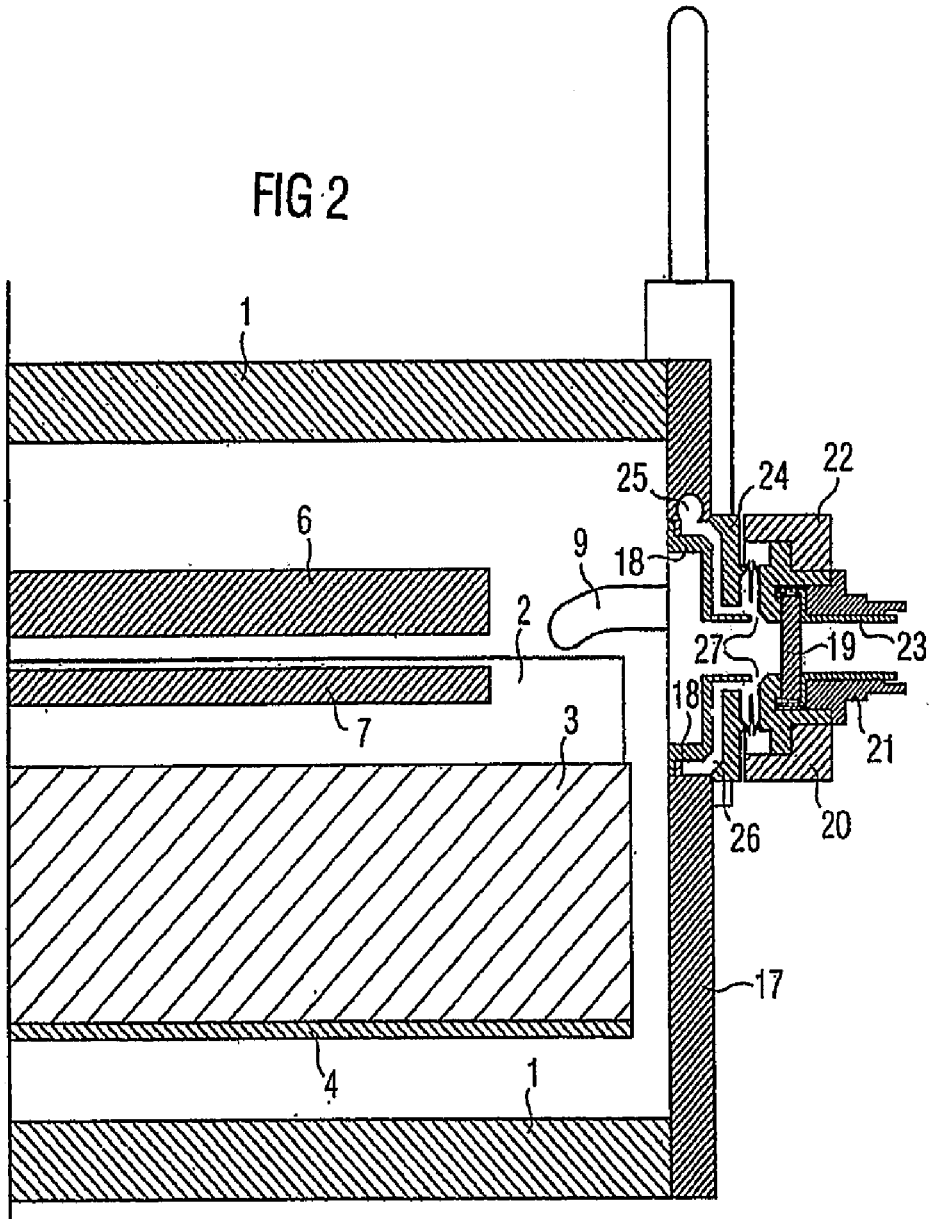

UNITED STATES PATENT AND TRADEMARK OFFICE
CERTIFICATE OF CORRECTION

PATENT NO.       : 6,798,814 B2
APPLICATION NO.  : 10/205567
DATED            : September 28, 2004
INVENTOR(S)      : Stephan Geiger et al.

It is certified that error appears in the above-identified patent and that said Letters Patent is hereby corrected as shown below:

Delete figure 3 and replace with.

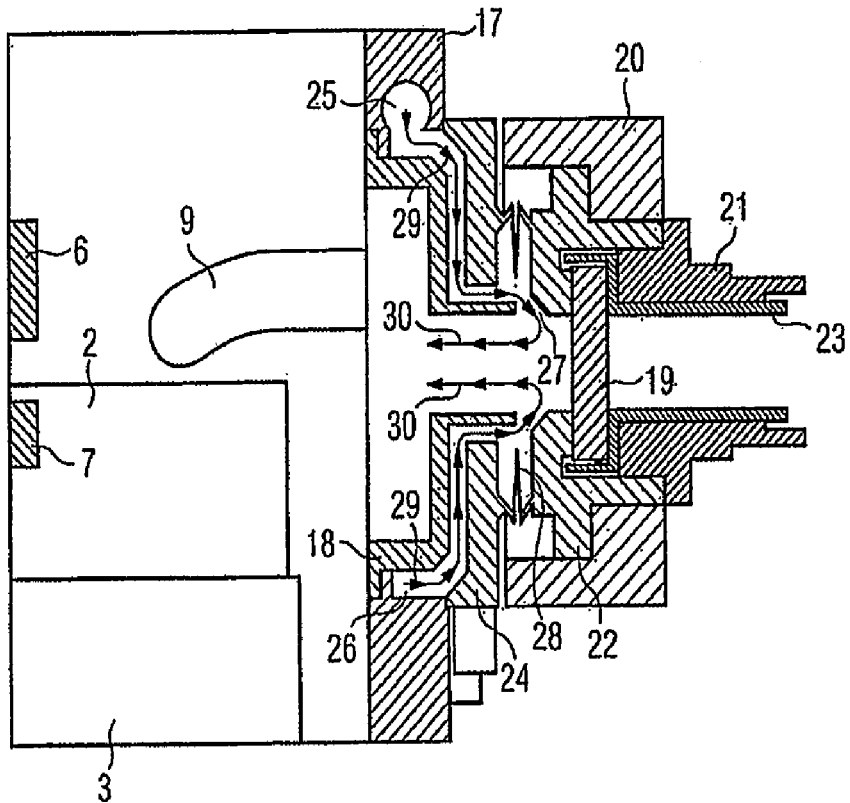

FIG 3

Signed and Sealed this

Tenth Day of April, 2007

JON W. DUDAS
*Director of the United States Patent and Trademark Office*

(12) United States Patent
Geiger et al.

(10) Patent No.: US 6,798,814 B2
(45) Date of Patent: Sep. 28, 2004

(54) GAS DISCHARGE LASER, METHOD OF OPERATING A GAS DISCHARGE LASER, AND USE OF A SINTERED FILTER

(75) Inventors: Stephan Geiger, Hebertshausen (DE); Claus Strowitzki, Gilching (DE); Tobias Pilanz, Munich (DE); Ansgar Matern, Germering (DE); Thomas Petracek, Munich (DE); Martin Kappels, Worthsee (DE); Andreas Goertler, Weil (DE)

(73) Assignee: TuiLaser AG, Germering (DE)

( * ) Notice: Subject to any disclaimer, the term of this patent is extended or adjusted under 35 U.S.C. 154(b) by 104 days.

(21) Appl. No.: 10/205,567

(22) Filed: Jul. 25, 2002

(65) Prior Publication Data
US 2003/0039291 A1 Feb. 27, 2003

(30) Foreign Application Priority Data
Jul. 25, 2001 (EP) .................................. 01117652

(51) Int. Cl.$^7$ .................................................. H01S 3/22
(52) U.S. Cl. ..................... 372/59; 372/58; 372/61; 372/65
(58) Field of Search ........................... 372/59, 58, 61, 372/55, 57, 98

(56) References Cited

U.S. PATENT DOCUMENTS

| 4,534,034 A | 8/1985 | Hohla et al. ............... 372/59 |
| 5,027,366 A | 6/1991 | Akins et al. ............... 372/57 |
| 5,029,177 A | 7/1991 | Akins et al. ............... 372/57 |
| 5,359,620 A | 10/1994 | Akins et al. ............... 372/58 |
| 5,917,066 A | 6/1999 | Eisenmann et al. ............ 55/502 |
| 6,340,378 B1 * | 1/2002 | Hinrichsen .................. 75/436 |
| 2002/0023419 A1 * | 2/2002 | Penth et al. ................ 55/523 |
| 2003/0039291 A1 * | 2/2003 | Geiger et al. ............... 372/55 |

FOREIGN PATENT DOCUMENTS

| DE | 3212928 | 10/1983 | |
| EP | 0669047 | 1/1999 | ........... H01S/3/225 |
| FR | 2545994 A1 * | 5/1983 | ........... H01S/3/09 |
| JP | 62243380 | 10/1987 | |
| JP | 11167146 A | * 6/1999 | ........... G03B/15/00 |
| JP | 2000357830 A | * 12/2000 | ........... H01S/3/03 |
| WO | WO-WO 94/11931 | 5/1994 | |

* cited by examiner

Primary Examiner—Leon Scott, Jr.
(74) Attorney, Agent, or Firm—Schwegman, Lundberg, Woessner & Kluth, P.A.

(57) ABSTRACT

The invention relates to a gas discharge laser including a discharge tube (1), in which a gas is present and which has at least one aperture (19) through which a laser beam emerges or at which a laser beam is reflected. For withdrawing a partial amount of the gas contained in the discharge tube (1), at least one gas withdrawal point (9) is present, from which the withdrawn gas is supplied to a sintered filter (11) for being cleaned. The cleaned gas may be led in via at least one gas inlet point (27) in the zone of the aperture (19). The invention further relates to a method of operating a gas discharge laser, and the use of a sintered filter for cleaning gas withdrawn from a discharge tube (1) of a gas discharge laser.

37 Claims, 2 Drawing Sheets